United States Patent [19]
Takasu et al.

[11] Patent Number: 6,145,060
[45] Date of Patent: Nov. 7, 2000

[54] DATA STORAGE DEVICE WITH ONLY INTERNAL ADDRESSING

[75] Inventors: Akihide Takasu, Akishima; Yuichi Masuda, Kunitachi, both of Japan

[73] Assignee: Casio Computer Co., Ltd., Tokyo, Japan

[21] Appl. No.: 09/000,309
[22] PCT Filed: May 20, 1997
[86] PCT No.: PCT/JP97/01686
§ 371 Date: Jan. 29, 1998
§ 102(e) Date: Jan. 29, 1998
[87] PCT Pub. No.: WO97/45839
PCT Pub. Date: Dec. 4, 1997

[30] Foreign Application Priority Data
May 30, 1996 [JP] Japan .................................. 8-136104

[51] Int. Cl.⁷ ...................................................... G06F 12/00
[52] U.S. Cl. ............................................ 711/154; 711/200
[58] Field of Search ..................................... 711/103, 154, 711/200

[56] References Cited

U.S. PATENT DOCUMENTS 4,368,988  1/1983  Tahara et al. .
5,818,781 10/1998  Estahhri et al. ......................... 365/226
5,903,868  5/1999  Yuen et al. .............................. 704/270

FOREIGN PATENT DOCUMENTS

0 294 202  12/1988  European Pat. Off. .
0 523 452   1/1993  European Pat. Off. .
2 223 620   4/1990  United Kingdom .
2 253 078   8/1992  United Kingdom .
WO 95/28702 10/1995  WIPO .

Primary Examiner—Eddie P. Chan
Assistant Examiner—Kevin L. Ellis
Attorney, Agent, or Firm—Frishauf, Holtz, Goodman, Langer & Chick, P.C.

[57] ABSTRACT

A data storage device comprises a controller and a semiconductor chip which includes a nonvolatile semiconductor memory having plural storage areas into each of which data is stored, a store instruction signal input terminal to which a store instruction signal is inputted, a storage controller for storing data into the semiconductor memory when receiving a store instruction signal through the store instruction signal input terminal, a read instruction signal input terminal to which a read instruction signal is inputted, and a read controller for sequentially specifying one of the storage areas in the semiconductor memory each time it receives a read instruction signal through the read instruction signal input terminal and then reading the data stored in the specified storage area. The controller includes a specifying data storage for storing specifying data that specifies one of the storage areas, a store instruction signal output circuit for outputting a store instruction signal to the store instruction signal input terminal of the semiconductor chip, and a read instruction signal output circuit for outputting a read instruction signal corresponding to the specifying data stored in the specifying data storage to the read instruction signal input terminal of the semiconductor chip.

11 Claims, 7 Drawing Sheets

DATA STORAGE DEVICE WITH ONLY INTERNAL ADDRESSING

TECHNICAL FIELD

This invention relates to a data storage device for storing various types of data, including audio data and image data.

BACKGROUND ART

There have been data storage devices that convert (A/D converts) an externally supplied analog signal, such as an audio signal or an image signal into digital data, store the digital data into a semiconductor memory, such as a RAM, read the data from the RAM as the need arises, decides (D/A converts) it, and output the decoded data, as disclosed in U.S. Pat. No. 4,368,988.

With conventional data storage devices, when a single semiconductor memory is used as an audio data recording and reproducing device for a single audio data item or an image data storage device for a single image (e.g., a single TV screen of image data), addressing is initiated, starting at the first address in the semiconductor memory in recording or reproducing audio data or in storing or reading image data. However, in a case where a single semiconductor memory is divided into blocks and the blocks are selectively recorded into or reproduced from image data is stored into the individual blocks, one image for one block, addressing must be initiated, starting at the head address of the selected block. To do this, it is necessary to send data on the head address of the selected block to the address control section, preset it, and update the addresses, starting at the head address.

When the encoded data is stored in a volatile memory, such as a RAM, the stored contents will disappear in the case of the expiration of the battery's service life, the replacement of the battery, or a power failure. To avoid the loss of the stored data, use of a nonvolatile memory, such as an EEPROM, can be considered. Such a nonvolatile memory, however, requires a very high driving voltage, as compared with a CMOS circuit that operates on about 1V, for example. For this reason, an electronic circuit for controlling recording and reproducing operations or image data storing and reading operations that operates on a relatively low voltage and an electronic circuit including nonvolatile memories have to be composed of separate chips, which need to be controlled by different voltages separately. As described above, when the main circuit section and the electronic circuit including nonvolatile memories are composed of separate chips and a single nonvolatile memory is divided into blocks as described earlier, and the blocks are selectively recorded into and reproduced from, the head address of each block must be addressed directly, with the result that a plurality of terminals are needed as the input terminals for address data, which leads to the problem that the size of the electronic circuit chip including nonvolatile memories becomes large.

DISCLOSURE OF THE INVENTION

The object of the present invention is to provide a data storage device capable of selectively storing and reading the data into or from the blocks in a semiconductor memory block by block without complicating the circuit configuration.

The foregoing object is accomplished by providing a data storage device comprising a semiconductor chip and a controller. The semiconductor chip includes a nonvolatile semiconductor memory having a plurality of storage areas into each of which data is stored, a store instruction signal input terminal to which a store instruction signal is inputted, a storage controller for storing data into the semiconductor memory when receiving a store instruction signal through the store instruction signal input terminal, a read instruction signal input terminal to which a read instruction signal is inputted, and a read controller for sequentially specifying one of the plurality of storage areas in the semiconductor memory each time it receives a read instruction signal through the read instruction signal input terminal and then reading the data stored in the specified storage area. The controller includes a specifying data storage for storing specifying data that specifies one of the plurality of storage areas, a store instruction signal output circuit for outputting a store instruction signal to the store instruction signal input terminal of the semiconductor chip, and a read instruction signal output circuit for outputting a read instruction signal corresponding to the specifying data stored in the specifying data storage circuit to the read instruction signal input terminal of the semiconductor chip. With this configuration, the semiconductor chip has only to be connected to the controller by means of just the store instruction signal input terminal and the read instruction signal input terminal, which offers the advantage of being able to selectively store and read the data into and from the blocks in the semiconductor memory block by block without complicating the circuit configuration or increasing the number of the terminals of the semiconductor chip.

BEST MODE OF CARRYING OUT THE INVENTION

Hereinafter, referring to the accompanying drawings, an electronic wristwatch, a portable electronic apparatus, according to an embodiment of the present invention will be explained.

A. The configuration of the embodiment

A-1. Block diagram

Figure 1:
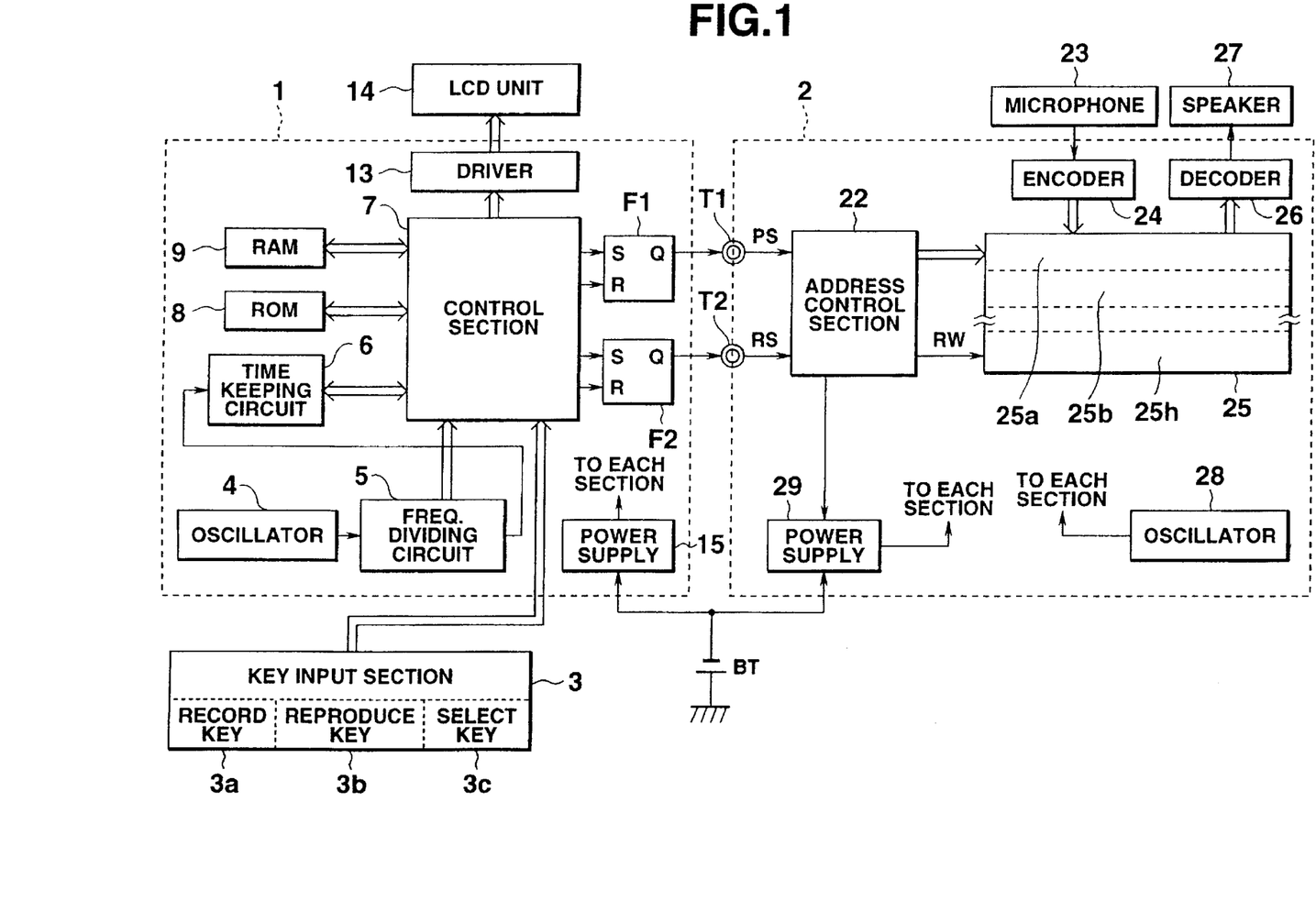
FIG. 1 is a block diagram of an electronic wristwatch according to an embodiment of the present invention.

FIG. 1 is a block diagram of an electronic wristwatch according to the embodiment of the present invention. In the figure, the electronic wristwatch of the embodiment has a watch function, a computer function, a data bank function that stores a lot of name and telephone number data items and others and displays them, and a memo function that makes notes of externally supplied speech in memory and reproduces it. The electronic wristwatch comprises a one-chip control integrated circuit 1 having, for example, a C-MOS device which includes the processing circuitry for the watch function, computer function, and data bank function, and a controller for controlling the recording and reproducing of audio data, and a one-chip memory control integrated circuit 2 which includes a nonvolatile memory constructed by, for example, a flash EEPROM in which audio data is stored, and an address controller for controlling the nonvolatile memory and its addresses. The control integrated circuit 1 and the memory control integrated circuit 2 operate on different driving voltages but receive a power supply from the same battery. They are designed to produce the necessary voltages in the power supply circuit in each integrated circuit. The control integrated circuit 1 is electrically connected to the memory control integrated circuit 2 by means of two lines via a reproduce instruction signal input terminal T1 and a record instruction signal input terminal T2 so that the memory control integrated circuit 2 may receive instruction signals to store and read the audio data into and from the nonvolatile memory under the control of the control integrated circuit 1.

First, the control integrated circuit 1 and its peripheral circuitry will be explained. A key input section 3 includes numerical keys and character keys (not shown) for entering various types of data, a record key 3a for recording audio data, a reproduce key 3b for reproducing the recorded audio data, and a select key 3c for selecting a block into or from which the data is recorded or reproduced among the storage area blocks (eight) in an EEPROM 25 explained later. Each key input signal from the key input section 3 is sent to a control section 7, which then senses the key input.

An oscillation circuit 4 generates a reference clock of a specific frequency and supplies it to a frequency dividing circuit 5. The frequency dividing circuit 5 divides the reference clock and thereby generates and outputs a system clock and various timing clocks for operating the various section, including a time keeping circuit 6 and a control section 7. On the basis of a one-second signal acting as a reference signal for time keeping in the timing clocks from the frequency dividing circuit 5, the time keeping circuit 6 clocks the present time (the date, the day of the week, hours, minutes, seconds) and supplies the present time data to the control section 7.

The control section 7 is a CPU (central processing unit) that realizes the above-described various functions of the electronic wristwatch by executing the specific microprograms fixedly stored in a ROM 8 explained later. In the embodiment, in particular, the microprograms include a program that records and reproduces the audio data into and from the blocks obtained by dividing the EEPROM 25, through a process explained later. Specifically, the control section 7 forces the block recorded into and reproduced from to be shift one block circularly each time the select key 3c is pressed, thereby causing the desired block to be selected. When the record key 3a is pressed, the control section causes the audio data on the speech inputted from a microphone 23 to be stored into the selected block in the EEPROM 25. When the reproduce key 3b is pressed, the control section causes the audio data stored in the selected block in the EEPROM 25 to be reproduced. The operations of the individual keys and the detailed operation of each section will be explained later.

The ROM 8 stores the microprograms executed by the control section 7 and various initial parameters. The RAM 9 is used as a register and working area that store the various data items produced as a result of the execution of the programs by the control section 7.

Figure 2:
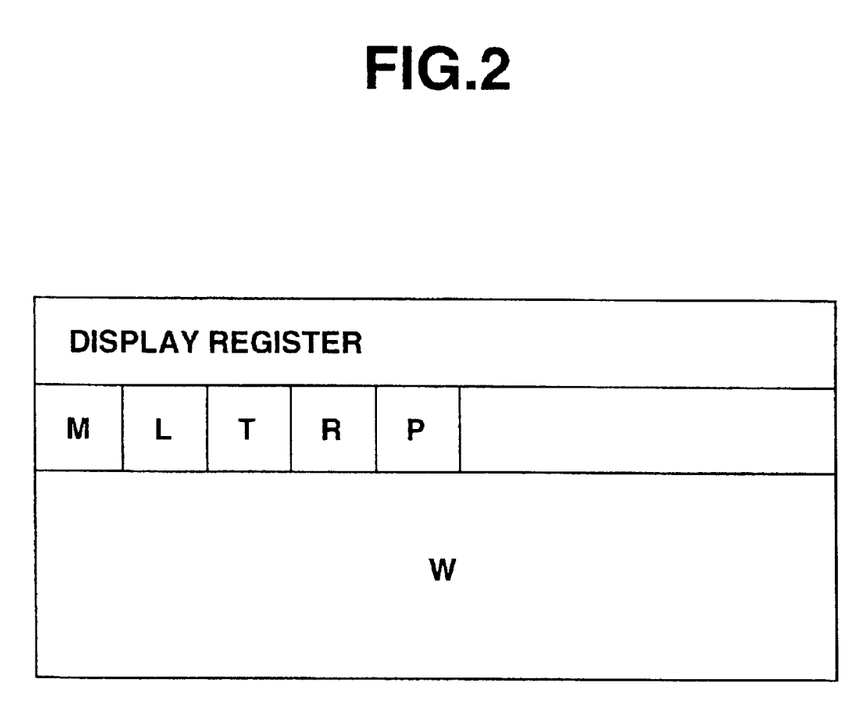
FIG. 2 is a conceptual drawing of the data structure of the RAM 9 in FIG. 1.

FIG. 2 is a conceptual drawing of the data structure of the RAM 9. In FIG. 2, a display register is a register for storing the data for displaying various data items on an LCD unit (liquid-crystal display unit) 14 explained later. Register M is a register for specifying the to-be-recorded block or to-be-reproduced block which is specified by the user among the eight blocks in the EEPROM 25. Next, register L is a register for indicating the block addressed by a high-order address counter 22f, explained later, in the memory control integrated circuit 2. Using the register L, the control integrated circuit 1 finds out which block is presently specified by the address control section 22 in the memory control integrated circuit 2.

Register T is a timer register used as a timer for clocking the recording/reproducing time (five seconds). Flag R is a flag for indicating that speech is now being recorded. When flag R is at "1," the speech inputted from the microphone 23 is taken in via an encoding section (an encoding circuit) 24 and is stored in the EEPROM 25 as audio data. Flag P is a flag for indicating that audio data is now being reproduced. When the flag is at "1," the audio data read from the EEPROM 25 is supplied to a decoding section (a decoding circuit) 26 explained later, which supplies the decoded data to a speaker 27. According to the decoded data, the speaker 27 outputs speech. Storage area W is an area for storing data on the computer function and data bank function.

In FIG. 1, a driver 13 displays on the LCD (liquid-crystal display) unit 14 various data items concerning the time, calculation data, and name and telephone number data supplied from the control section 7 and the audio data stored in the EEPROM 25. The LCD unit 14 is composed of dot-matrix or segment type electrodes. In the clock mode, the LCD unit displays the date and present time. In selecting a block, the LCD unit displays the date, the present time, and the selected block as shown in an example of a representation explained later. In recording or reproducing the audio data, the LCD unit displays at least the date, the present time, and the recording time (blinking representation).

Each of the flip-flops F1 and F2 supplies to the address control section 22 of the memory control integrated circuit 2 the output Q whose output level is turned on and off under the control of the control section 7, as a reproduce instruction signal PS and a record instruction signal RS, respectively. The power supply 15 converts the supply voltage from the common battery BT into a driving voltage for operating the control integrated circuit 1 and supplies the driving voltage to each of the above-described sections.

Next, the memory control integrated circuit 2 and its peripheral circuitry will be explained. On the basis of the reproduce instruction signal PS supplied from the flip-flop F1 in the control integrated circuit 1 and the record instruction signal RS supplied from the flip-flop F2, the address control section 22 generates not only a high-order address (a block specifying address) and a low-order address (an address in the block) in the EEPROM 25, but also an R/W (write/read) signal to the EEPROM 25, and supplies these to the EEPROM 25.

Figure 3:
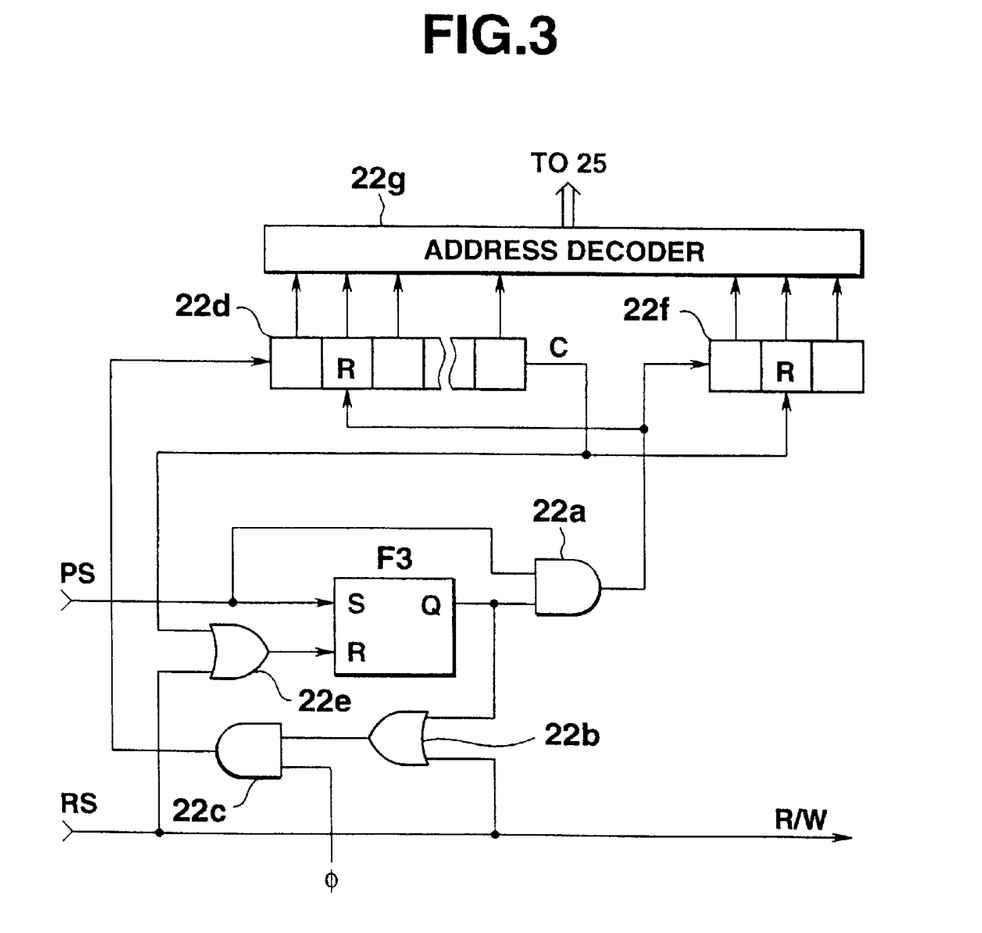
FIG. 3 is a circuit diagram of the address control section 22 in FIG. 1.

FIG. 3 is a circuit diagram of the address control section 22. In FIG. 3, when a reproduce instruction signal PS (one pulse) is inputted to the set terminal S, the flip-flop F3 is set (Q=1) and outputs its output Q to an AND circuit 22a. When a reproduce instruction signal PS is inputted again with the output Q of the flip-flop F3 at "1" (during reproduction), the AND circuit 22a outputs a one-pulse signal to reset (clear) the low-order address counter 22d and increases the high-order address by one. Namely, when in the reproducing state, the reproduce instruction signal PS is inputted again, the reproducing state of the block is discontinued and the audio data in the next block is to be reproduced.

When either the output Q of the flip-flop F3 or the record instruction signal RS (=R/W signal: "1" during recording) is at "1," or when the audio data is being reproduced or recorded, an OR circuit 22b supplies an output of "1" to an AND circuit 22c. When the output from the OR circuit 22b is at "1," or while the flip-flop F3 remains set after the input of the reproduce instruction signal PS, or while the record instruction signal RS ("1") is being inputted, or in other words, during reproducing or recording, clock φ from an oscillation circuit 28 explained later is supplied to the low-order address counter 22d.

While the reproduce instruction signal PS or record instruction signal RS is being supplied, or while the audio data is being reproduced or recorded as described earlier, the low-order address counter 22d counts clock φ supplied via the AND circuit 22c and thereby updates (increases) the addresses, starting at the head address, in the block in the EEPROM 25 specified by a high-order address counter explained later. When completing the counting for one block, that is, when completing the recording or reproducing of one block, the low-order address counter 22d supplies a carry signal to an OR circuit 22e and a high-order address counter 22f. When being supplied with either the carry signal C from the low-order address counter 22d or the record instruction signal RS, the OR circuit 22e supplies an output of "1" to the reset terminal R of the flip-flop F3, thus resetting the flip-flop F3.

The high-order address counter 22f contains three bits as described earlier and is designed to specify one of the eight blocks in the EEPROM 25 by using the three bits. When the reproduce instruction signal PS is inputted again and the output of the AND circuit 22a goes to "1" during reproducing, the high-order address counter 22f counts the output and replaces the to-be-recorded block or to-be-reproduced block with the next block. When the a carry signal C is outputted from the low-order address counter 22d, that is, when the recording or reproducing of one block has been completed, the high-order address counter 22f is reset (cleared). An address decoder 22g decodes the counts in the low-order address counter 22d and high-order address counter 22f and specifies an address in the EEPROM 25.

Hereinafter, explanation of addressing will be explained in connection with the operation of the key input section 3.

(1) When the reproduce key 3b is pressed, the flip-flop F1 outputs a reproduce instruction signal PS of one pulse (as explained later). As a result, the flip-flop F3 is set and the low-order address counter 22d counts clock φ. Because the R/W signal (=record instruction signal RS) is at "0" at that time, the audio data stored in the addressed block is read out in the EEPROM 25.

(2) When the reproduce key 3b is pressed again during the reproducing of the audio data, the output of the AND circuit 22a goes to "1," the low-order address counter 22d is reset (cleared) and the reproducing of the block is stopped. At the same time, the count of the high-order address counter 22f is increased by one, making the next block a to-be-reproduced block. Then, the audio data in the block newly specified by the high-order address counter 22f is read sequentially, starting at the head address, on the basis of the count in the low-order address counter 22d.

(3) When the record key 3a is pressed, the flip-flop F1 outputs the reproduce instruction signal PS in a process explained later until the count of the high-order address counter 22f has reached the value corresponding to the block specified by the select key 3c, and thereafter the flip-flop F2 outputs a record instruction signal RS of "1." As a result, the flip-flop F3 is reset and the low-order address counter 22d counts clock φ. Because the R/W signal (=record instruction signal RS) is at "1" at that time, the audio data is stored sequentially in the block addressed by the count of the high-order address counter 22f in the EEPROM 25, according to the count of the low-order address counter 22d.

In FIG. 1, the microphone 23 collects the speech of the user and supplies the audio signal to the encoding section 24. The encoding section 24, which includes an amplifier, a filter, an A/D converter circuit (all of these not shown), converts the audio signal into digital data (audio data) and supplies the digital data to the EEPROM 25. The decoding section 26 coverts the audio data supplied from the storage area of the block in the EEPROM 25 accessed by the address control section 22 into an analog signal, which is then outputted from the speaker 27 in the form of speech.

The EEPROM 25 is chiefly constructed by about two megabits of flash memory in total, which has eight blocks 25a to 25h, each capable of storing audio data for five seconds. The address counter in the EEPROM 25 is divided into the high-order address counter 22f of the high-order three bits and the low-order address counter 22d. Each block is specified by the high-order three bits. Specifically, the first block is specified by "000," the second block by "001," the third block by "010,". . . , and the eighth block by "111." The audio data taken in via the microphone 23 and encoding section 24 is stored into specific blocks in sequence through access by the address control section 22. The oscillation circuit 28 generates specific timing clocks and clock φ for operating the EEPROM 25 and the others, and supplies these clocks to the various sections, including the address control section 22 and EEPROM 25. The power supply (power supply circuit) 29 converts the supply voltage from the common battery BT into a driving voltage for operating the memory control integrated circuit 2 and supplies the driving voltage to the aforementioned various sections. The power supply 29 does not supply electricity to the oscillation circuit 28 or the EEPROM 25 when recording or reproducing is not effected, but supplies electricity when recording or reproducing is performed. To achieve this, the "1" output signal from the OR circuit 22b is supplied to the address control section 22 during a recording or reproducing operation, for example.

A-2. Outward configuration

Figure 4:
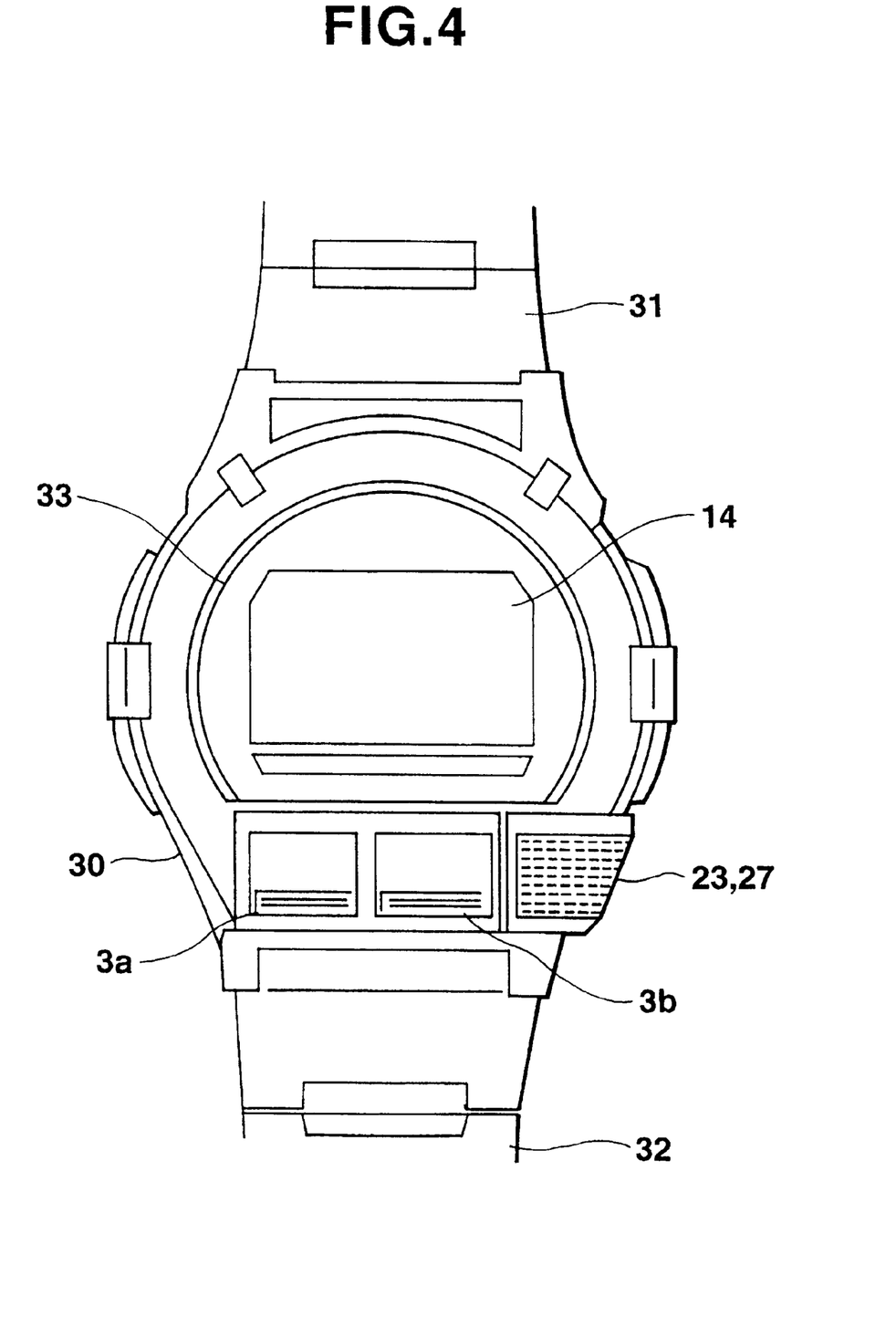
FIG. 4 is an outward view of the electronic wristwatch of the embodiment.

FIG. 4 shows the outward configuration of the electronic wristwatch. In FIG. 4, on the front of a watch case 30, the LCD (liquid-crystal display) unit 14 is provided which displays the date, time, and various types of data (image data). The wrist case 30 is worn on the arm with bands 31, 32. The LCD unit 14 is protected by a glass 33. Below the LCD unit 14, there are provided the microphone 23 for receiving speech and a speaker 27 for reproducing the recorded audio data. Moreover, below the LCD unit 14, there are provided the record key 3a for specifying the start of the recording of speech and the reproduce key 3b for specifying the reproducing of the recorded audio data. On one side of the watch case 30, there is provided the select key 3c (not shown).

B. The operation of the embodiment

The operation of the electronic wristwatch of the embodiment will be explained. The watch function, computer function, and data bank function are the same as those of a conventional equivalent, so explanation of them will not be given. Hereinafter, the operation of recording and reproducing the audio data into and from the EEPROM 25 will be explained.

(1) Main processing

Figure 5:
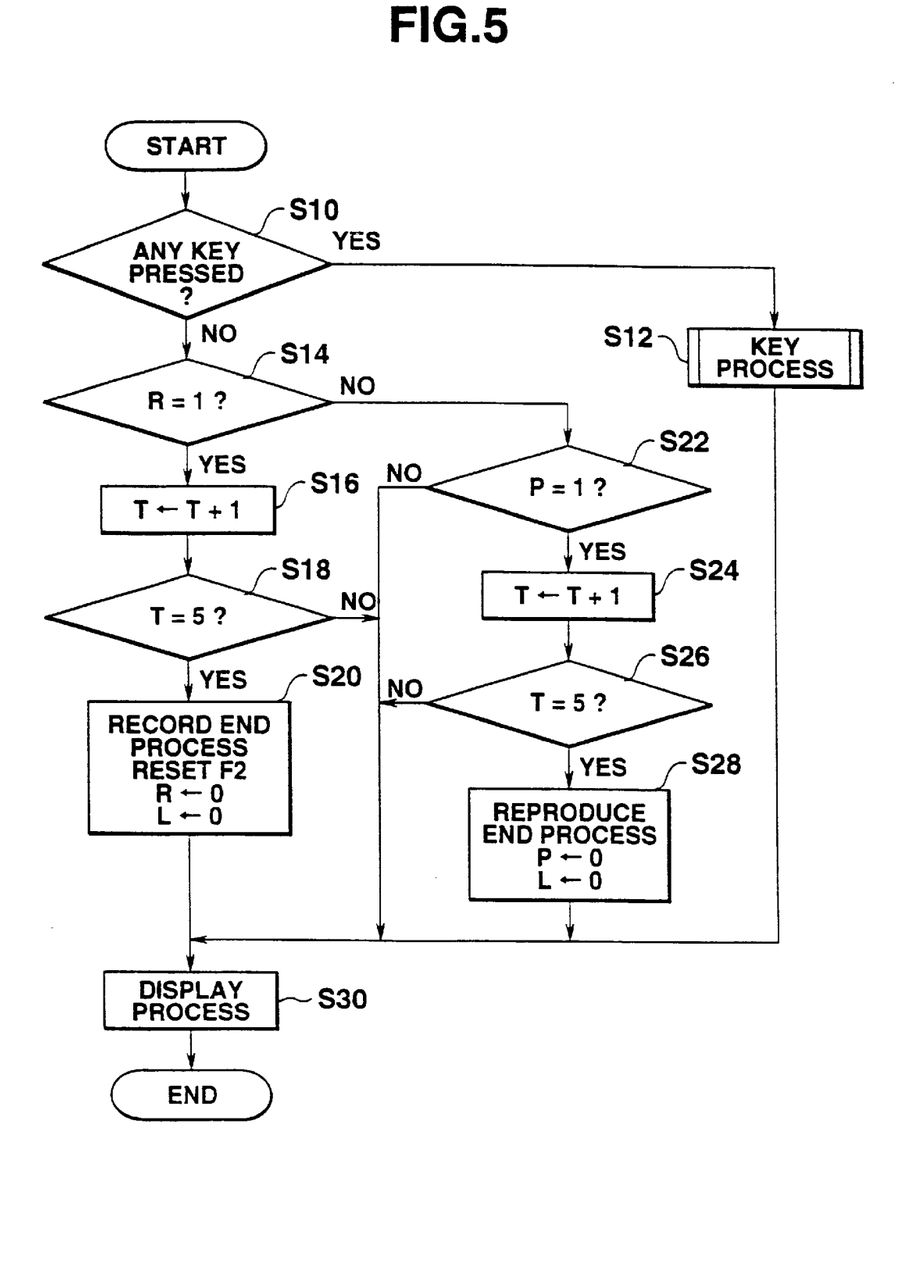
FIG. 5 is a flowchart to help explain the main operation in the embodiment.

FIG. 5 is a flowchart to help explain the main operation in the embodiment. First, at step S10, it is determined whether or not any key has been pressed at the key input section 3. If it has been determined that any key has been pressed, control will proceed to step S12. At step S12, the key processes explained later will be executed according to the pressed key (the record key 3a, reproduce key 3b, select key 3c, or the other keys). If no key has been pressed, control will go to step S14, where it is determined whether or not the record flag R is at "1." If the record flag R is at "1," that is, when the audio data is being recorded, control will proceed to step S16.

Hereinafter, steps S16 to S20 are the processes executed during recording. First, at step S16, the recording time is clocked by increasing the count of timer T by one second. At step S18, it is determined whether or not the count of timer T has reached five seconds. If the count of timer T has not reached five seconds, control will proceed to step S30, where a display process will be executed. If the count of timer T has reached five seconds, that is, if five seconds of recording (the recording of one block) have ended, control will go to step S20, where the flip-flop F2 will be reset and both of the record flag R and the register L indicating the addressed block are made "0," and the recording process will be terminated. Thereafter, at step S30, the display process will be executed.

At step S14, if the record flag R is not at "1," that is, if the audio data is not being recorded, control will proceed to step S22. Hereinafter, steps S22 to S28 are the processes during recording. First, at step S22, it is determined whether or not the reproduce flag P is at "1." If the reproduce flag P is not at "1," that is, if the audio data is not being reproduced, control will go to step S30, where the display process will be performed. If the reproduce flag P is at "1," that is, if the audio data is being reproduced, control will proceed to step S24, where the reproducing time will be clocked by increasing the count of timer T by one second. At step S26, it is determined whether or not the count of timer T has reached five seconds. If the count of timer T has not reached five seconds, control will go to step S30, where the display process will be carried out.

If the count of timer T has reached five seconds, that is, if five seconds of reproducing (the reproducing of one block) have finished, control will proceed to step S28, where both of the reproduce flag P and the register L indicating the addressed block will be made "0" and the reproducing process will be terminated. Thereafter, at step S30, the display process is executed.

(2) Key processing

Figure 6:
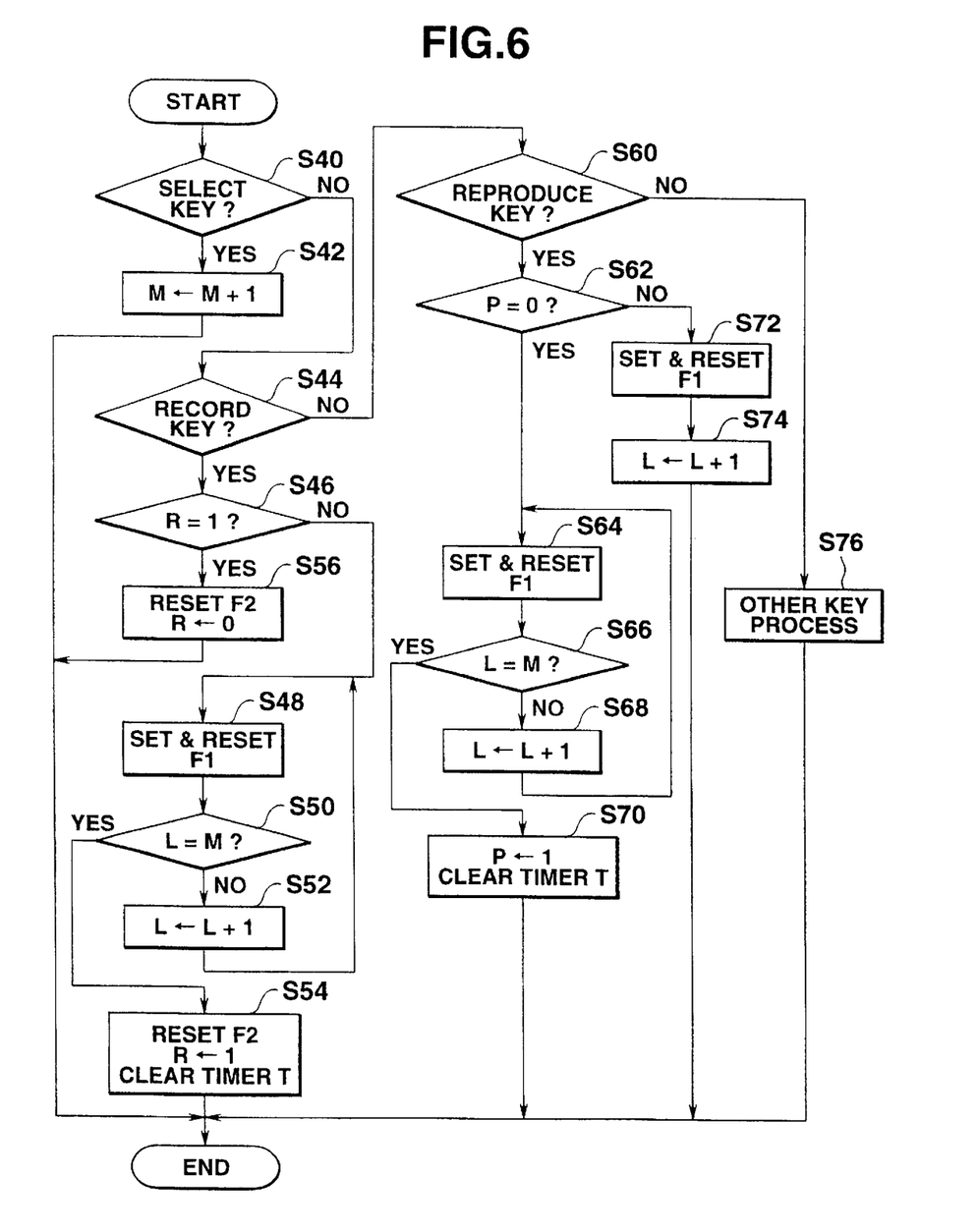
FIG. 6 is a flowchart to help explain the operation of key processing in FIG. 5.

FIG. 6 is a flowchart to help explain the operation of key processing in the embodiment. Hereinafter, explanation will be given about the block specifying process of specifying a block to be recorded into or reproduced from, the recording process of storing the audio data into the specified block, and the reproducing process of reproducing the audio data stored in the specified block.

a. Block specifying process

Steps S40 to S42 explained below are the processes of specifying a block to be recorded into or reproduced from the EEPROM 25. First, at step S40, it is determined whether or not the key operated at step S10 is the select key 3c. If the select key 3c has been pressed, the value of register M indicating the selected and specified block is increased by one, thereby advancing the to-be-recorded block or to-be-reproduced block by one in position. Then, the current process is terminated and control returns to the main process.

Figure 7:
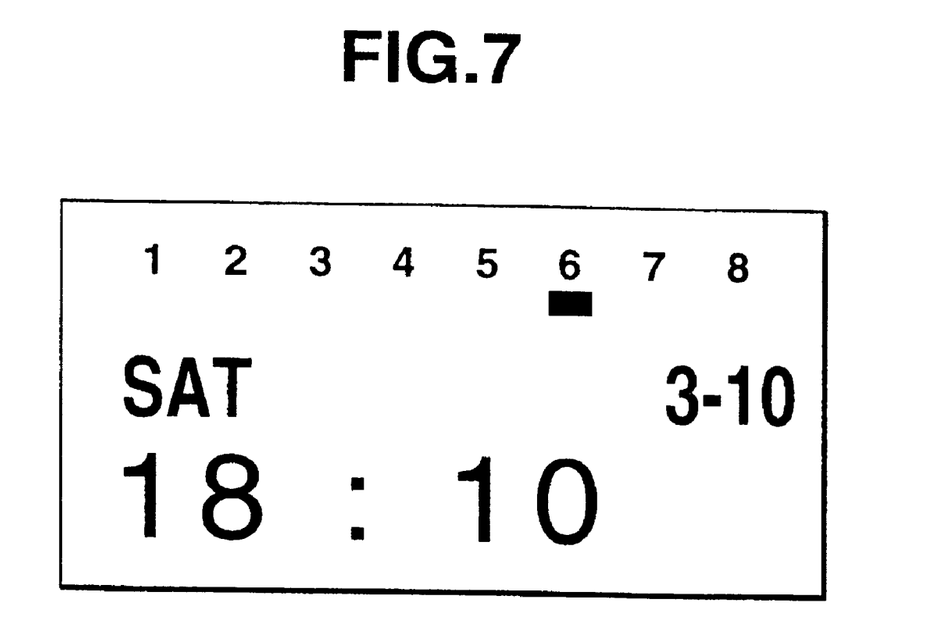
FIG. 7 is a schematic representation appearing on the LCD unit 14 in specifying a block.

As described above, each time the select key 3c is pressed, the value of the register M is increased, thereby advancing the block to be specified by one at a time. For example, if the sixth block (M=6) is specified by pressing the select key 3c, the recording date (the date, the time, and the day of the week), the blocks into which the audio data has been stored, and the selected (specified) block will appear on the LCD unit. In the example shown in the figure, the blinking rectangular symbol (the sixth block in the figure) indicates the to-be-recorded block. At this time, the value of the high-order address counter 22f is "000" indicating the first block and the value of the register L is "0."

b. Recording process

Steps S44 to S56 explained below are the recording processes executed when the record key 3a has been pressed. At step S40, if it has been determined that the select key 3c has not been pressed, control will proceed to step S44, where it will be determined whether or not the record key 3a has been pressed. If the record key 3a has been pressed, control will go to step S46, where it will be determined whether or not the record flag R is at "1", that is, whether or not the audio data is being recorded. If the audio data is not being recorded, control will proceed to step S48, where the flip-flop F1 will be set and reset, thereby sending a reproduce instruction signal PS (one pulse). This will set the flip-flop F3.

At step S50, it is determined whether or not the value of the register L is equal to the value of the register M. In this case, because the value of the register L is "0" and the value of the register M is "6," control goes to step S52, where the value of the register L is increased by one to specify the second block, and thereafter control proceeds to step S48. From this time on, step S48 and step S52 are repeated until the value of the register L has become equal to the value of the register M. Each time step S48 and step S52 are repeated, the flip-flop F1 is set and reset, thereby sending a reproduce instruction signal PS (one pulse). As a result, each time step S48 is executed, the output of the AND circuit 22a goes to "1," which increases the count of the high-order address counter 22f by one at a time, updating the specified block in this order: the first block, the second block, . . . , the sixth block. Similarly, each time step S52 is executed, the value of the register L is increased, updating the specified block in this order: the first block, the second block, . . . , the sixth block.

Figure 8:
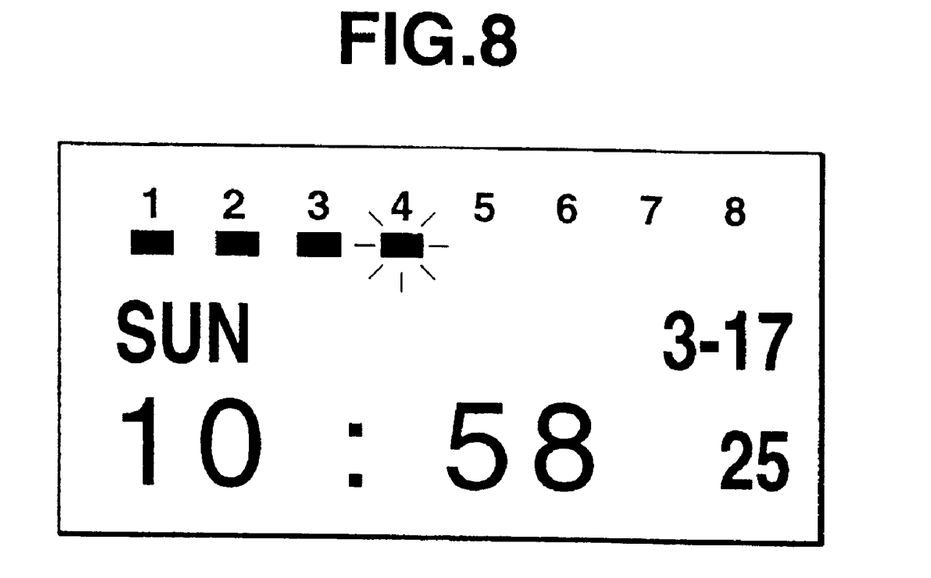
FIG. 8 is a schematic representation appearing on the LCD unit 14 in a recording or reproducing operation.

When the value of the register L (=the count of the high-order address counter) has become equal to the value of the register M, control will proceed from step S50 to S54, where the flip-flop F2 will be set to send a record instruction signal RS and the record flag R will be set at "1" and timer T will be cleared, which will complete the current process. Then, in the memory control integrated circuit 2, the high-order address counter 22f in the address control section 22 specifies a block in the EEPROM 25 and the low-order address counter 22d updates the address of the specified block sequentially. As a result, the audio data inputted from the microphone 23 and converted at the encoding circuit 24 is stored sequentially into the block specified by the address control section 22. In this case, because the record flag R is at "1," steps S16, S18, and S20 are executed when control returns to the main routine of FIG. 5. During recording, the recording time appears on the LCD unit in such a manner that the rectangular symbol is forced to light or blink as shown in FIG. 8. In the figure, at the present time, an elapse of four seconds is shown (the symbol corresponding to the fourth block is blinking).

When the record key 3a is pressed again during recording (R=1), control proceeds from step S46 to step S56. At step S56, the flip-flop F2 is reset, which stops the recording of the audio data and makes the record flag "0." Then, the current process is terminated.

When five seconds have elapsed without the record key 3a being pressed again during recording (R=1), the determination at step S18 of FIG. 5 shows "YES," so that control proceeds to step 20, where the aforementioned record end process is executed. As a result, in the control integrated circuit 1, the flip-flop F2 is reset and the record flag R and register L are made "0" and control returns to the initial state. Furthermore, in the memory control integrated circuit 2, because a carry signal C is outputted from the low-order address counter, the high-order address counter is also reset.

c. Reproducing process

Steps S60 to S74 explained below are the reproducing processes when the reproduce key b has been pressed. When at steps S40 and S44, it has been determined that neither the select key 3c nor the record key 3a has been pressed, control will proceed to step S60, where it will be deteermined whether or not the reproduce key 3b has been pressed. If the reproduce key 3b has not been pressed, control will go to step S76, where the other key processes will be executed, which will complete the current process. If the reproduce key has been pressed, control will proceed to step S62, where it is determined whether or not the reproduce flag P is at "0," that is, whether or not the audio data is being reproduced. If the audio data is not being reproduced, control will proceed to step S64, where the flip-flop F1 will be set and reset to send a reproduce instruction signal PS (one pulse). This sets the flip-flop F3.

Next, at step S66, it is determined whether or not the value of the register L is equal to the value of the register M. Here, it is assumed that the value of the register L is "0" and the value of the register M is "6." In this case, because the value of the register L is not equal to the value of the register M, control goes to step S68, where the value of the register L is increased by one to specify the second block, and thereafter control returns to step S64. From this time on, step S64, step 66, and step S68 are repeated until the value of the register L has become equal to the value of the register M. Each time step S64, step 66, and step S68 are repeated, the flip-flop F1 is set and reset, thereby sending a reproduce instruction signal PS (one pulse). As a result, each time step S64 is executed, the output of the AND circuit 22a goes to "1," which increases the count of the high-order address counter 22f by one at a time, updating the specified block in this order: the first block, the second block, . . . , the sixth block. Similarly, each time step S68 is executed, the value of the register L is increased, updating the specified block in this order: the first block, the second block, . . . , the sixth block.

When the value of the register L (=the count of the high-order address counter) has become equal to the value of the register M, control will proceed from step S66 to S70, where the reproduce flag P will be set at "1" and timer T will be cleared, which will complete the present process. Then, in the memory control integrated circuit 2, the high-order address counter 22f in the address control section 22 specifies a block in the EEPROM 25 and the low-order address counter 22d updates the address of the specified block sequentially. As a result, the audio data stored in the block specified by the address control section 22 is converted into an analog signal at the decoding circuit 26 and the speaker 27 outputs speech according to the analog signal. In this case, because the reproduce flag P is at "1," steps S24, S26, and S28 are executed when control returns to the main routine of FIG. 5. As in recording, during reproducing, the reproducing time appears on the LCD unit in such a manner that the rectangular symbol is forced to light or blink as shown in FIG. 8. In the figure, at the present time, an elapse of four seconds is shown (the symbol corresponding to the fourth block is blinking).

When the reproduce key 3b is pressed again during reproducing (P=1), control proceeds from step S62 to step S72. At step S72, the flip-flop F1 is set and reset, which causes the AND circuit 22a to output one pulse, increasing the count of the high-order address counter by one, thereby making the next block a block to be specified. As a result, the audio data stored in the next block is reproduced. At this time, the value of the register L is increased by one. In the reproducing process, the reproducing of the audio data is always stopped only whenever the count of timer T has reached five seconds (at step S26).

While in the embodiment, the example of applying the present invention to a portable electronic wrist-watch has been explained, the present invention may be applied to various pieces of electronic equipment other than an electronic wristwatch. For instance, the invention may be applied to information apparatuses, such as a portable telephone, a pager, or an electronic notebook, or to various types of electronic apparatuses of the desktop type, not the portable type. The memory for storing the audio data is not restricted to a flash EEPROM. It is possible to use other types of volatile memories or nonvolatile memories. Furthermore, in addition to the recording and reproducing of audio data, the present invention may be applied to the storing and displaying of other types of data, such as image data.

What is claimed is:

1. A data storage device comprising:
   a first semiconductor chip including:
      a data input terminal to which data is inputted;
      a semiconductor memory having a plurality of storage areas into which the data inputted to said data input terminal is stored;
      a store instruction signal input terminal to which a store instruction signal is inputted;
      a storage control section configured to store the data inputted to said data input terminal into said semiconductor memory when receiving a store instruction signal through said store instruction signal input terminal;
      a read instruction signal input terminal to which read instruction signals are inputted;
      an address specifying section configured to specify an address in said semiconductor memory; and
      a read control section configured to sequentially specify, one by one, said plurality of storage areas in said semiconductor memory each time one of the read instruction signals is received through said read instruction signal input terminal, and to then read the data stored in the specified one of said storage areas; and
   a control unit including:
      a specifying data storage section configured to store specifying data that specifies one of said plurality of storage areas;

a store instruction signal output section configured to output a store instruction signal to said store instruction signal input terminal of said first semiconductor chip;

a storage area specifying switch section configured to specify plural areas in said semiconductor memory;

a changing section configured to chance the specifying data in said specifying data storage section when said storage area specifying switch section has been operated;

a present specifying data storage section configured to store the data indicating one of the storage areas which is presently specified by the read control section in said first semiconductor chip; and a read instruction signal output section configured to output to said read instruction signal input terminal of said first semiconductor chip a number of the read instructions signals corresponding to a difference between the data stored in said present specifying data storage section and the specifying data stored in said specifying data storage section.

2. A data storage device according to claim 1, wherein said first semiconductor chip further includes a jump control section configured to cause the address in said address specifying section to jump, when one of the read instruction signals has been inputted again to said read instruction signal input terminal, with said read control section being in the data reading state.

3. A data storage device according to claim 1, wherein said semiconductor memory comprises a nonvolatile memory.

4. A data storage device according to claim 1, wherein said control unit and said first semiconductor chip are operated on different voltages.

5. A data storage device according to claim 1, wherein said control unit is provided in a second semiconductor chip different from said first semiconductor chip and said first and second semiconductor chips are operated on different voltages.

6. A data storage device comprising:

a first semiconductor chip incorporating a semiconductor memory into which data is stored; and a control unit configured to send a store instruction signal to control the writing of data into said semiconductor memory built in said first semiconductor chip and a read instruction signal to control the reading of the data stored in said semiconductor memory, wherein said first semiconductor chip further includes:

a data input terminal to which data is inputted;

a store instruction signal input terminal to which a store instruction signal from said control unit is inputted;

a read instruction signal input terminal to which a read instruction signal from said control unit is inputted;

an address specifying section configured to specify an address in said semiconductor memory;

a write and read control section configured to sequentially update the address in said address specifying section when receiving the store instruction signal through said store instruction signal input terminal, thereby storing the data inputted to said data input terminal into said semiconductor memory, and to sequentially update the address in said address specifying means when receiving the read instruction signal from said read instruction signal input terminal, thereby reading the data stored in said semiconductor memory;

a data output terminal configured to output the data read from said semiconductor memory; and a jump control section configured to cause the address in said address specifying means to jump, when the read instruction signal is inputted again to said read instruction signal input terminal, with said write and read control means in the data reading state.

7. A data storage device according to claim 6, wherein said control unit further includes a read specifying switch section and, when the read specifying switch section has been operated, said control unit outputs said read instruction signal to said read instruction signal input terminal.

8. A data storage device according to claim 6, wherein said control means includes:

a specifying data storage section configured to store specifying data that specifies one of said plurality of storage areas;

a storage area specifying section configured to selectively specify plural storage areas in said semiconductor memory;

a changing section configured to change the specifying data in said specifying data storage section when a storage area specifying switch section has been operated;

a read specifying switch section; and a read instruction signal output section configured to output a read instruction signal corresponding to the specifying data stored in said specifying data storage section to said read instruction signal input terminal, when said read specifying switch section has been operated.

9. A data storage device according to claim 6, wherein said semiconductor memory comprises a nonvolatile memory.

10. A data storage device according to claim 6, wherein said control unit and said first semiconductor chip are operated on different voltages.

11. A data storage device according to claim 6, wherein said control unit is provided in a second semiconductor chip different from said first semiconductor chip and said first and second semiconductor chips are operated on different voltages.

* * * * *